United States Patent [19]

Jin et al.

[11] Patent Number: 5,765,277

[45] Date of Patent: Jun. 16, 1998

[54] DIE BONDING APPARATUS WITH A REVOLVING PICK-UP TOOL

[75] Inventors: Ho Tae Jin, Chungcheongnam-do; Sung Bok Hong, Chungcheongnam-dong; Jae Ky Roh; Hee Kook Choi, both of Chungcheongnam-do, all of Rep. of Korea

[73] Assignee: Samsung Electronics Co., Ltd., Suwon, Rep. of Korea

[21] Appl. No.: 723,859

[22] Filed: Sep. 30, 1996

[30] Foreign Application Priority Data

Sep. 30, 1995 [KR] Rep. of Korea ............... 1995-33329

[51] Int. Cl.⁶ .................... H05K 13/04; H01L 21/58; H01L 21/60
[52] U.S. Cl. .................... 29/743; 29/740; 29/827; 29/DIG. 44; 228/6.2; 294/64.1; 414/737; 414/752; 414/941; 437/220
[58] Field of Search ............... 29/740, 741, 743, 29/827, 834, 840, DIG. 44; 228/6.2, 49.1, 49.5, 180.21; 294/64.1; 414/737, 738, 739, 752, 753, 935, 941; 437/220

[56] References Cited

U.S. PATENT DOCUMENTS

| | | | |
|---|---|---|---|
| 3,604,108 | 9/1971 | Mallery | 228/180.21 X |
| 5,197,650 | 3/1993 | Monzen et al. | 228/6.2 |
| 5,516,026 | 5/1996 | Ariye et al. | 228/6.2 |
| 5,579,980 | 12/1996 | Ichikawa | 29/743 X |

FOREIGN PATENT DOCUMENTS

| | | | |
|---|---|---|---|
| 56-153742 | 11/1981 | Japan | 228/6.2 |
| 63-81937 | 4/1988 | Japan | 228/6.2 |
| 61027 | 3/1989 | Japan | 228/6.2 |
| 93137 | 4/1989 | Japan | 228/6.2 |

*Primary Examiner*—Peter Vo
*Attorney, Agent, or Firm*—Jones & Volentine, L.L.P.

[57] ABSTRACT

A die bonding apparatus for separating a chip from a tested wafer including a plurality of chips and attaching the chip to a lead frame comprising a chip-transferring part for separating the chip from the wafer and transferring the chip to a place where a lead frame is prepared for die bonding; a stage where the transferred chip is placed; a bond head for compressing the chip and the lead frame to bond them together; and a lead frame-transferring part for transferring the lead frame to a predetermined place, the chip-transferring part being comprised of a first rectilinearly moving picking tool and a second revolving picking tool.

10 Claims, 4 Drawing Sheets

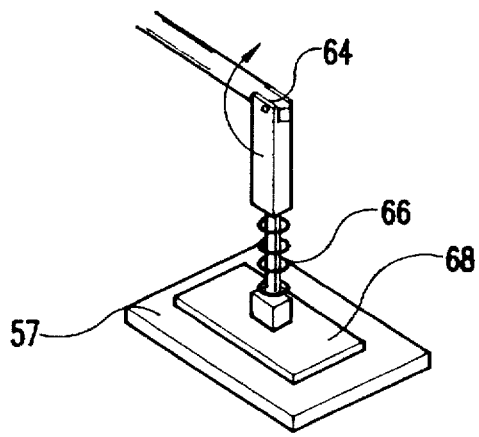
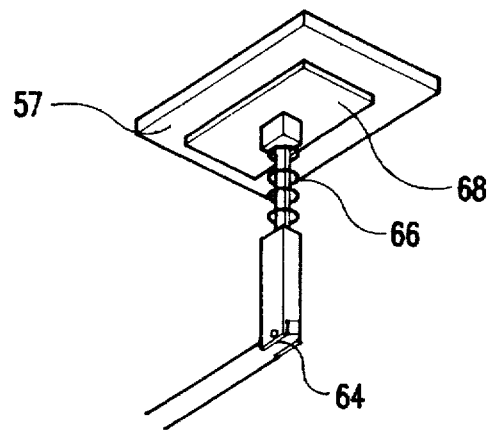
FIG.7A
FIG.7B
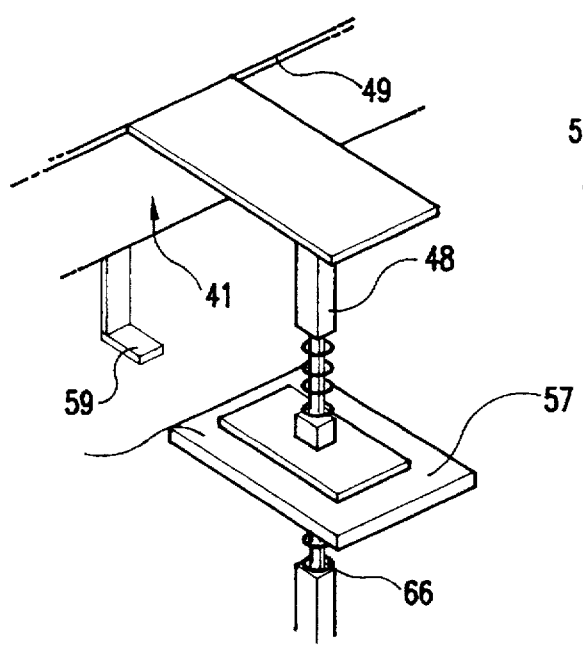
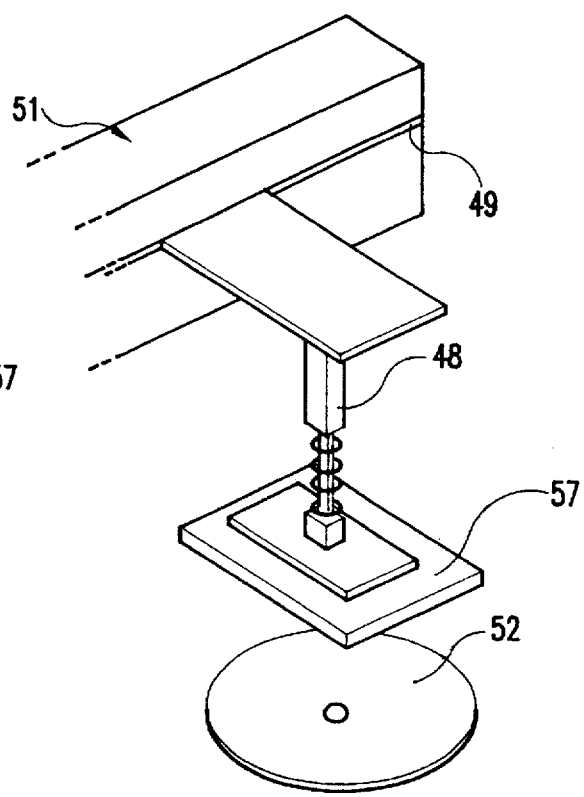
FIG.7C
FIG.7D

DIE BONDING APPARATUS WITH A REVOLVING PICK-UP TOOL

BACKGROUND OF THE INVENTION

The present invention relates generally to a die bonding apparatus. More particularly, the present invention relates to a die bonding apparatus provided with a pick-up tool which can be used for die bonding of Lead on Chip (LOC) and Chip on Lead (COL) packages and a lead frame pad package.

A process of "die bonding" or "die attachment" is a step wherein individual chips, called dice, which are produced by scribing a wafer containing a plurality of chips after Electrical Die Sorting (EDS) tests, are attached to a lead frame using some kind of adhesive.

The die attachment can be accomplished by attaching a chip onto a lead frame by using an Ag-epoxy adhesive and then curing the chip-lead frame subassembly at a temperature of about 100°–300° C.; by employing an eutectic process in which gold (Au) and glass are used as an adhesive; or by employing a soldering usually used for the bonding of transistor devices to the lead frame. A chip may also be attached onto the lead frame using an adhesive tape. These different die-attachment methods may be classified into two general categories: Lead on Chip (LOC) and Chip on Lead (COL).

FIG. 1 is a view schematically depicting a die bonding of an LOC package. As shown in FIG. 1, a lead frame 2 is attached using a polyimide tape 4 on one surface of the lead frame, onto which a semiconductor chip 6 is attached. The tape 4 is attached onto an active surface of the chip 6, i.e., a surface where circuit patterns are formed, and the chip 6 located under the lead frame 2.

FIG. 2 is a view schematically depicting a die bonding of a COL (Chip on Lead) package. A lead frame 12 is attached with a polyimide tape 14 onto an inactive surface of a chip 16, i.e., a surface opposite to the active surface where circuit patterns are formed. The chip 16 is also attached onto the tape 14.

For both of LOC and COL bonding technologies, the chip 6 or 16 is electrically connected to the lead frame 2 or 12 by way of wire 8 or 18.

The adhesive tape used for the LOC and COL packages is a double-sided adhesive tape, one side of which is bonded to the chip and the other side is bonded to the lead frame. The adhesive used may be any one of a variety of thermosetting or thermoplastic resins. If the tape is made adhesive by a thermosetting resin, the chip will be attached to the lead frame at a temperature of about 100°–300° C. and a pressure of about 0.1–2 Kg, and will be cured at a temperature of 100°–300° C. in order to obtain a suitable bonding strength to endure external stresses. In comparison, if the tape is made adhesive by a thermoplastic resin, the chip can be attached onto the lead frame under conditions of a temperature above 350° C. and a pressure above 1 Kg without any additional steps such as curing.

In addition, a chip can be attached onto a lead frame pad onto which an adhesive tape is layered.

FIG. 3 is a partial detailed perspective view of a semiconductor device package using a lead frame pad. As described above, the semiconductor chip 26 is attached onto a pad of lead frame 22 by way of an adhesive tape 24. The chip is then attached onto the lead for COL and LOC packages. In the device of FIG. 3, the chip 26 is electrically connected to inner leads of the lead frame by way of wires 28.

FIG. 4 is a schematic view of a conventional die bonding apparatus employed for die bonding LOC packages. As shown in FIG. 4, the conventional die bonding apparatus comprises a chip-transferring part 41; a stage; a bond head; and a lead frame-transferring part. The chip-transferring part 41 separates or picks up a chip 47 from a wafer 40 and transfers the chip 47 to a place where a lead frame is prepared for die bonding. The stage 42 supports the lead frame and the chip during the die bonding. The bond head 43 compresses the chip 47 and the lead frame 45 to bond them together. The lead frame-transferring part 44 transfers the lead frame 45 to a predetermined place. The chip-transferring part 41 comprises a picking tool 48 for picking up the chip from the wafer by an action of vacuum or the like and a path 49 for transferring the picking tool.

The lead frame-transferring part 44 transfers a lead frame 45 provided with a thermosetting or thermoplastic resin tape on its upper and lower surfaces under the bond head 43, and the chip-transferring part 41 places the chip 47 onto the stage 42. After the location of the chip 47 is confirmed with a camera 46, the stage 42 carrying the chip 47 moves under the lead frame 45 which is located under the bond head 43. The lead frame 45 is then bonded to the chip 47 by compressing the lead frame 45 with the bond head 43 at a predetermined temperature and pressure.

Unfortunately, this type of die bonding apparatus as shown in FIG. 4 can not be applied to die bonding of a COL package as shown in FIG. 2 or of a lead frame pad package as shown in FIG. 3, since the apparatus functions by picking up the chip so that the active surface (the surface where circuit pattern is formed) of the chip faces upward. The conventional device transfers and attaches the chip under the lead frame so that the active surface of the chip faces the lower surface of the lead frame. In contrast the COL package shown in FIG. 2 and the lead frame pad package shown in FIG. 3 each have a structure in which the chip is attached onto the lead frame such that the active surface of the chip faces downward.

For this reason, the conventional die bonding apparatus for the LOC package can be applied to the LOC package only, resulting in a low equipment efficiency and a high production cost for the whole type packages.

SUMMARY OF THE INVENTION

Thus, an object of the invention is to provide a die bonding apparatus which can be applied for the die bonding process regardless of the type of the package structure.

This object can be accomplished by a die bonding apparatus for separating a chip from a tested wafer including a plurality of chips and attaching the chip to a lead frame, the die bonding apparatus comprising: a chip-transferring part for separating the chip from the wafer and transferring the chip to a place where a lead frame is prepared for die bonding; a stage where the transferred chip is placed; a bond head for compressing the transferred chip and the lead frame to bond the chip and lead frame together; and a lead frame-transferring part for transferring the lead frame to a predetermined place, wherein the chip-transferring part being comprises a first rectilinearly moving picking tool and a second revolving picking tool.

This object can also be accomplished using a process for attaching a chip to a lead frame using a die bonding apparatus, the process comprising the steps of: picking up the chip from a wafer including a plurality of sawed chips and rotating the chip to a predetermined degree by a second picking tool of a chip-transferring part of a die bonding apparatus and; transferring the chip from the second picking tool to a first picking tool; transferring the chip to a stage, where the chip is placed on the stage by the first picking tool; and transferring the chip to the lead frame where the chip is attached to the lead frame by bond head.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIGS. 7A through 7D depict a successive steps of transferring a chip from a wafer containing a plurality of chips to a die-bonding stage by using the revolving pick-up tool according to a preferred embodiment of the present invention.

DETAILED DESCRIPTION OF THE INVENTION

The present invention will now be described in more detail with reference to accompanying drawings.

Figure 1:
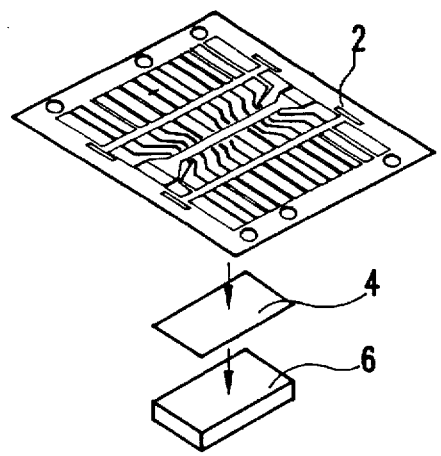
FIG. 1 is a perspective view depicting a known Lead on Chip (LOC) bonding.
Figure 2:
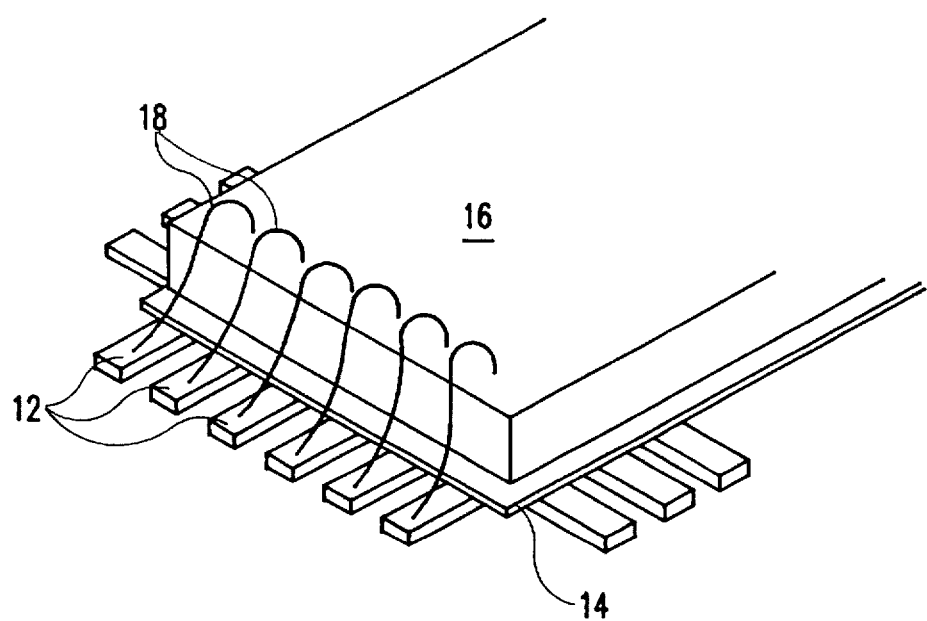
FIG. 2 is a partial detailed perspective view depicting a known Chip on Lead (COL) bonding chip.
Figure 3:
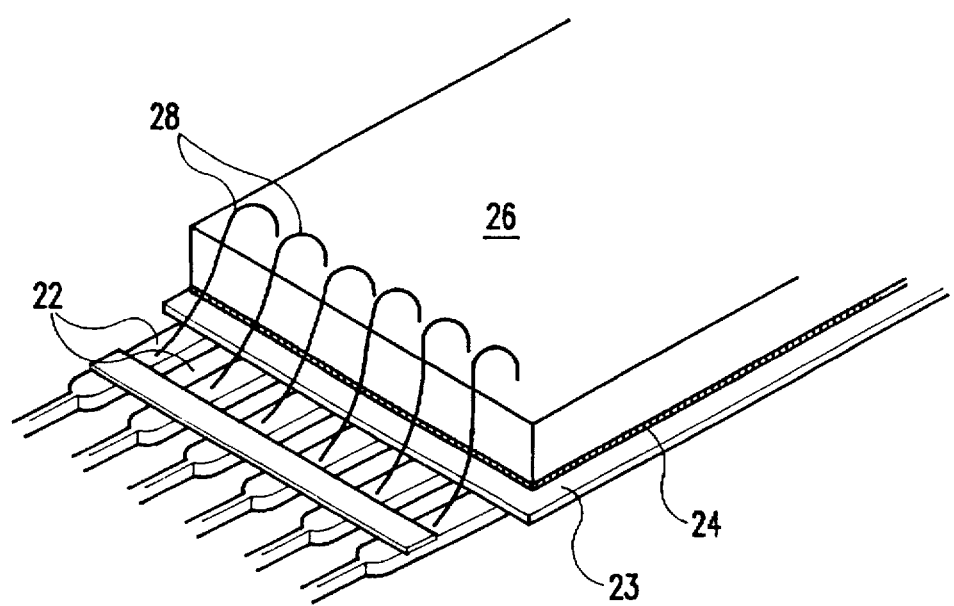
FIG. 3 is a partial detailed perspective view of a semiconductor device package using a known lead frame pad.
Figure 4:
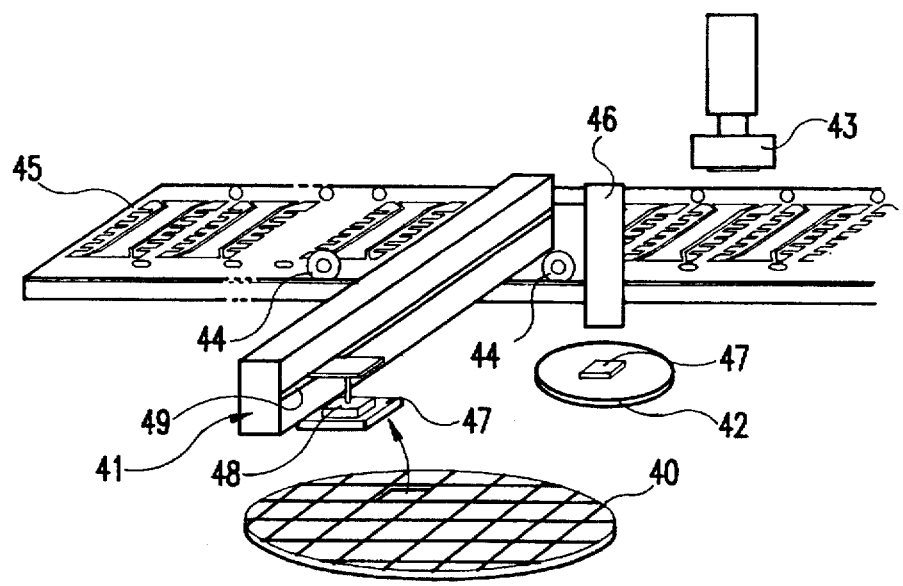
FIG. 4 is a schematic view of a conventional die bonding apparatus employed for the LOC bonding.
Figure 5:
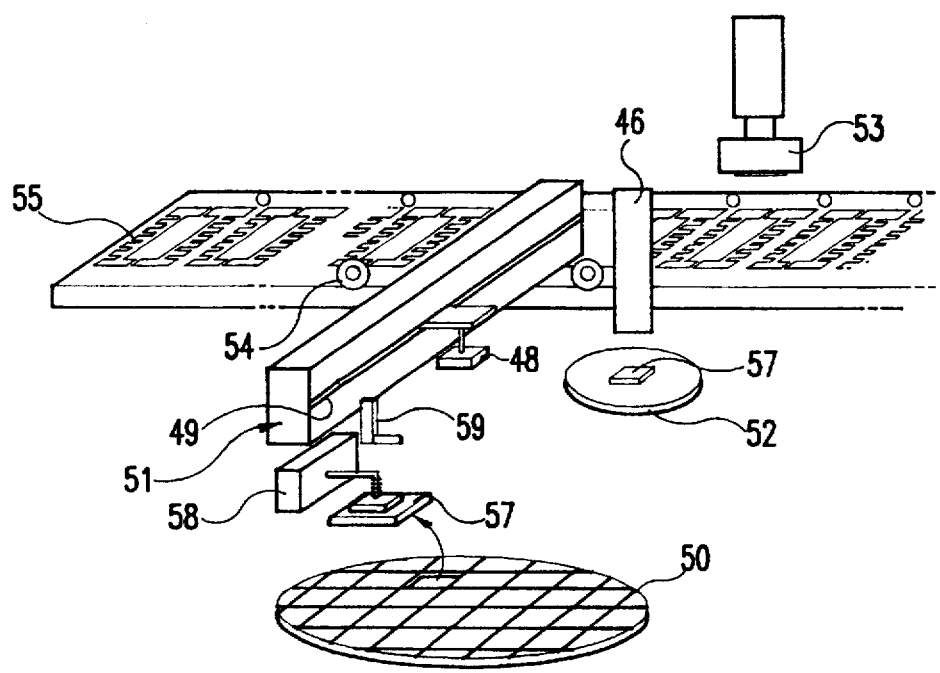
FIG. 5 is a schematic view of a die bonding apparatus according to a preferred embodiment of the present invention.

FIG. 5 is a schematic view of a die bonding apparatus according to a preferred embodiment of the present invention. The die bonding apparatus shown in FIG. 5 comprises a chip-transferring part 51; a stage 52; a bond head 53; and a lead frame-transferring part 54. The chip-transferring part 51 separates a chip 57 from a wafer 50 and transfers the chip to a place where a lead frame 55 is prepared for die bonding. The stage 52 is where the transferred chip is placed, and is the part which supports the lead frame 55 and the chip 57 during the die bonding. The bond head 53 for compresses the chip 57 and the lead frame 55 to bond them together. The lead frame-transferring part 54 transfers the lead frame 55 to a predetermined place. The chip-transferring part 51 comprises a second picking tool 58 for separating and picking up a chip from a wafer, a first rectilinearly moving picking tool 48 receiving the chip from the second picking tool and transferring the chip to the stage 52, and a stopper 59 for aligning the first and second picking tools. The same numerical reference 48 is used for the first picking tool since the later is the same as that of the conventional apparatus shown in FIG. 4.

The picking tool 48 of the conventional die bonding apparatus can perform a rectilinear motion only, which permits the separation and picking up of a chip from a wafer, and the transfer of the chip to the die bonding place. In contrast, the second picking tool 58 of the present invention can perform 180 degree or 360 degree rotations as well as linear motions. The die bonding apparatus of the preferred embodiment of the present invention can be applied to the die bonding of the LOC package as well as that of the COL package in which the orientation of the active surface of the chip is opposite to that of the LOC package.

Figure 6:
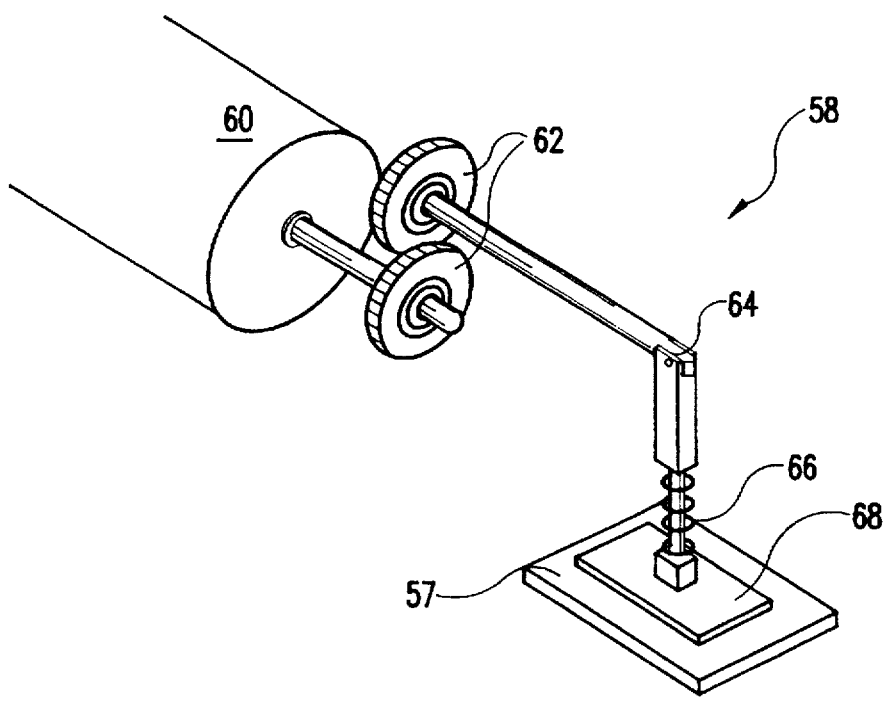
FIG. 6 is a partial detailed view of an embodiment of the revolving pick-up tool of the die bonding apparatus according to a preferred embodiment of the present invention.

FIG. 6 is a partial detailed description of one embodiment of the second picking tool 58 according to a preferred embodiment of the present invention. The second picking tool 58 preferably comprises a driving motor 60 for rotating the tool, a cam or gear 62 for transferring the motor's motion to the tool and controlling the revolution degree, an arm 64 made of tungsten or aluminum, and a collet 68 for picking up a chip from a wafer by an action of vacuum or the like. The collet 68 is preferably connected with a spring 66 provided between the collet 68 and the arm 64 in order to reduce a shock or stress on the chip when the chip is separated and picked up from the wafer. The spring preferably has a weight between about 5 gf and 30 gf. The spring may also provided at the first picking tool 48.

FIGS. 7A through 7D depict a process of transferring a chip from a wafer containing a plurality of chips to a die-bonding stage by using the revolving pick-up tool according to a preferred embodiment of the present invention.

As shown in FIG. 7A, the collet 68 of the second picking tool 58 picks up a good die from a Electrical Die Sorting (EDS) tested wafer. In this case, the active surface of the chip 57, where circuit patterns are formed, faces upward. When the arm 64 rotates by a motion of a motor (not shown), the collet 68, which is connected to the arm 64 at a right angle and carries a chip 57, rotates 180 degrees so that the inactive surface now faces upward, as shown in FIG. 7B.

As shown in FIG. 7C, the chip-transferring part is further provided with a stopper 59 located at a position where the rotated second picking tool is aligned to the first picking tool in a vertical direction. In other words, the stopper 59 blocks the rotation of the second picking tool 58 at a point where it is in a desired alignment, e.g., when a 180 degree rotated second picking tool is correctly aligned to the first picking tool 48. When the second picking tool 58 is aligned to the first picking tool 48, the vacuum applied to the second picking tool is turned off and at the same time vacuum is applied to the first picking tool. This allows the chip 57 to be transferred from the second picking tool 58 to the first picking tool 48. The first picking tool 48 now carries the chip 57 and moves along the path 49 to the stage 52 as shown in FIG. 7D.

FIGS. 7A through 7D depict a modification of the conventional die bonding apparatus for the LOC package, in which a revolving second picking tool 58 is provided and which permits an application of the apparatus to the die bonding of the COL and lead frame pad packages. In other words, when die bonding a COL package, the chip is inverted to 180 degrees so that its active surface is changed from facing upward to facing downward. For this case, it should be noted that the lead frame also should be mounted on the lead frame-transferring part (44 in FIG. 4) in the inverted form.

When the apparatus according to a preferred embodiment of the present invention is used for the die bonding of the LOC package, the second picking tool 58 need not be operated and the device can act as a conventional device.

Furthermore, the second picking tool 58 as described above may be applied to various shaped, or sized chips by replacing its collet 68 with an appropriate other collet depending on the shape or size of the chip to be transferred.

As described above, the die bonding apparatus provided with a rectilinearly moving picking tool 48 as well as a revolving picking tool 58 allows a free control of the orientation of the active surface of the chip to be transferred from the wafer and be attached to the lead frame so that the apparatus can be applied to the die bonding of LOC package as well as COL or lead frame pad packages and an increase in productivity for the package and cost save can be attained.

The present invention is not limited to the above-described embodiments. Various changes and modifications may be effected by one having an ordinary skill in the art and remain within the scope of the invention, as defined by the appended claims.

What is claimed is:

1. A die bonding apparatus for separating a chip from a tested wafer including a plurality of chips and attaching the chip to a lead frame, the die bonding apparatus comprising:
   a stage comprising a bonding place;
   a chip-transferring part positioned proximate to the stave for separating the chip from the wafer and transferring the chip to the bonding place;
   a lead frame-transferring part for transferring the lead frame to the bonding place; and
   a bond head positioned above the lead frame for pressing the chip and the lead frame against the stage to bond the chip and lead frame together,
   wherein the chip-transferring part comprises a first rectilinearly moving picking tool and a second revolving picking tool.

2. The die bonding apparatus of claim 1, wherein the first and second picking tools are aligned to each other in a vertical direction, and the second picking tool can rotate 180 degrees.

3. The die bonding apparatus of claim 1, wherein the chip-transferring part further comprises a stopper located to prevent further rotation of the second revolving picking tool when the second picking tool is aligned to the first picking tool in a vertical direction.

4. The die bonding apparatus of claim 1, wherein the chip-transferring part further comprises a path along with its linear direction, and the first picking tool moves along the path.

5. The die bonding apparatus of claim 1, wherein the second picking tool comprises:
   a driving motor for revolving the tool; a collet for picking up a chip;
   an arm connected to the collet; and
   a gear, which is connected between the motor and the arm, for transferring the motor's motion to the arm.

6. The die bonding apparatus of claim 5, wherein an elastic spring is provided between the collet and the arm.

7. The die bonding apparatus of claim 1, wherein the lead frame is for a lead-on-chip (LOC) package, and a separation and transfer of said chip is performed by the first picking tool.

8. The die bonding apparatus of claim 1, wherein the lead frame is for a chip-on-lead (COL) package, and a separation of said chip is performed by the second picking tool, a transfer of the chip is performed by the first picking tool, and an orientation of an active surface of the chip during the separation is opposite to the orientation during the transfer.

9. The die bonding apparatus of claim 1, wherein the lead frame is a lead frame having a pad onto which said chip is attached, and a separation of the chip is performed by the second picking tool, a transfer of the chip is performed by the first picking tool, and an orientation of an active surface of the chip during the separation is opposite to that during the transfer.

10. The die bonding apparatus of claim 1, wherein the collet of the second picking tool is detachable from the arm of the tool.

* * * * *